United States Patent [19]

Meyer et al.

[11] Patent Number: 4,635,190
[45] Date of Patent: Jan. 6, 1987

[54] INTEGRATED DYNAMIC WRITE-READ MEMORY WITH A DECODER BLOCKING THE DATA PATH FROM THE MEMORY MATRIX

[75] Inventors: Willibald Meyer; Jürgen Wawersig, both of Munich, Fed. Rep. of Germany

[73] Assignee: Siemens Aktiengesellschaft, Berlin and Munich, Fed. Rep. of Germany

[21] Appl. No.: 592,870

[22] Filed: Mar. 23, 1984

[30] Foreign Application Priority Data

Mar. 29, 1983 [DE] Fed. Rep. of Germany ....... 3311427

[51] Int. Cl.$^4$ ................................................ G11C 7/00
[52] U.S. Cl. ..................................................... 365/200
[58] Field of Search ........................................ 365/200

[56] References Cited

U.S. PATENT DOCUMENTS 3,753,244 8/1973 Sumilas et al. ...................... 365/200
4,459,685 7/1984 Sud et al. ............................. 365/200
4,538,245 8/1985 Smarandolu et al. ............... 365/200

OTHER PUBLICATIONS

Electronics, 3/24/82, pp. 121–124.
Electronic 1980, H.22, p. 93, Chapt. 2.7.1.
1981 IEEE Internat'l Solid States Circuit Conf., pp. 84–85.
1976 IEEE Internat'l Solid States Circuit Conf., pp. 128–129.
Electronics, 4/28/77, pp. 115–119.

Primary Examiner—James W. Moffitt
Attorney, Agent, or Firm—Herbert L. Lerner; Laurence A. Greenberg

[57] ABSTRACT

An integrated dynamic write-read memory includes at least one redundant row and/or column initially excluded from normal operation of the memory but available for normal operation as a replacement. At least one row decoder is connected to the memory matrix and at least one column decoder is connected to the memory matrix for addressing. A column address pulse is fed to the memory matrix for initiating addressing by matrix columns and a row address pulse is fed to the memory matrix for initiating addressing by matrix rows. A normal data path leading out of the memory matrix includes a tristate output connected to the normal data path and actuated by addressing with the stored digital data. Another decoder is connected in the normal data path between the memory matrix and the tristate output with an output connected to the tristate output. The other decoder blocks the normal data path from the memory matrix to the tristate output upon addressing each row or column of the portion of the memory matrix intended for normal operation replaced by a redundant row or column and upon simultaneous external activation of the other decoder. The other decoder also indicates the insertion of a redundant row or column in place of a row or column in the portion of the memory matrix intended for normal operation with the appearance of a uniform indicating signal at the data output.

14 Claims, 9 Drawing Figures

$\Phi_{PC}$ = logisch "1"; $\Phi_{EC}$ = logisch "$\Phi$"; $\Phi_{C1}...\Phi_{Cj}$ = logisch "$\Phi$"

INTEGRATED DYNAMIC WRITE-READ MEMORY WITH A DECODER BLOCKING THE DATA PATH FROM THE MEMORY MATRIX

The invention relates to an integrated dynamic write-read memory, wherein a memory matrix, which is formed of identical memory cells, is addressable with respect to the individual memory cells through at least one row decoder and one column decoder, the addressing by matrix columns being initiated by a column address stroke $\overline{CAS}$ while the addressing by matrix rows is initiated by a row address pulse $\overline{RAS}$, wherein the memory matrix also includes at least one redundant row and/or column which is initially excluded from the normal operation of the memory and is available for normal operation as a replacement, only on the basis of a special measure.

As is known, in many dynamic write-read memories, so-called DRAMs, each operational cycle begins with the row address pulse $\overline{RAS}$, which reads in and temporarily stores all row addresses through the address lines. At least one of the memory cells is switched to the read amplifiers belonging to the individual column lines (bit lines) by appropriate actuation of the respective row lines (word lines). These amplifiers pick up the digital information entered in the particular addressed memory cell. The information is thus temporarily stored and made available for the data output of the memory. Upon completion of the particular readout cycle, the temporarily stored information is then returned by the respective read amplifier to the addressed memory cell, resulting in the information entered in the respective memory cell being refreshed entirely independently of the associated column address stroke, due to the row address pulse $\overline{RAS}$.

The second part of each access is initiated by the column address pulse $\overline{CAS}$, which reads in and stores the column addresses, i.e. the bit line addresses The decoding is also controlled by the column address pulse $\overline{CAS}$, in accordance with the row selection pulse $\overline{RAS}$. The column address pulse $\overline{CAS}$ switches the terminal of the read amplifier connected with the addressed memory cell to an interim register, which simultaneously serves for amplifying the data once more.

Integrated semiconductor memories are also used in which the matrix thereof contains additional rows and columns which, to begin with, are not intended for the normal operation of the memory as such. However, if a defect occurs at one or more memory cells that are intended for normal operation, it is then possible to replace the row or column containing the defective cell by a redundant row or column, which is then made accessible for normal operation for which they are at first blocked, by appropriate measures. To this end it is common practice to prevent the redundant rows and columns from responding to normal operation by appropriate shortcircuit connections. The activation then occurs by interrupting these shortcircuit connections. Such redundant rows and columns are used frequently (as seen in the Publication "Elektronik" (1980), No. 22, P. 93, chtr. 2.7.1), since they permit increased yield in the production of such matrix memories.

For dynamic or quasi-static RAMs which are provided with redundant memory cells and which have been "repaired" in the manner just indicated because of defective memory cells which have been found, it is advantageous to provide for mass production. It is known to be of importance with respect to mass production of such memories, to be able to distinguish a chip that had been subjected to such repair from a satisfactory chip of the same lot. It may also be important to locate the defect even though it has been rendered ineffective by the repair. In fact, it would be desirable to have the information about this location available before the test concerning normal operation is carried out. It would also be desirable to provide a way of separating the signals which serve to address the memory cells intended for normal operation from the start, from the signals needed for addressing the various redundant memory cells. It would then be possible to test the memory components repaired by the use of redundant cells in correct topology, and to analyze additional defects more thoroughly and more easily.

In the Publication "Electronics" (Mar. 24, 1982), pp. 121-124, a static RAM memory is described which also has redundant memory cells and which uses a "roll call circuit" for the recognition of activated redundant columns. This roll call circuit is activated by applying a higher voltage at the data input terminal in comparison with the data level to be used for normal operation, and then using the column addresses cyclically. Every time a matrix column replaced by a redundant column is addressed, a signal logic "1" appears at the data output.

It is accordingly an object of the invention to provide an integrated dynamic write-read memory, which overcomes the hereinaforementioned disadvantages of the heretofore-known devices of this general type, so as to indicate the replacement of memory cells in the cell field intended for normal operation by redundant memory cells and to indicate the addresses of defective word lines and of defective bit lines by a logic level at the data output of the memory with an actuation corresponding to the roll call mode. With the foregoing and other objects in view, there is provided, in accordance with the invention, an integrated dynamic write-read memory including a memory matrix for storing digital data formed of individual identical memory cells having a portion intended for normal operation, at least one redundant row and/or column initially excluded from normal operation of the memory and available for normal operation as a replacement on the basis of a special measure, at least one row decoder connected to the memory matrix and at least one column decoder connected to the memory matrix for addressing with respect to the individual memory cells, means for feeding a column address pulse to the memory matrix for initiating addressing by matrix columns, means for feeding a row address pulse to the memory matrix for initiating addressing by matrix rows, and a normal data path for the stored digital data leading out of the memory matrix, the improvement comprising a data output for the memory in the form of a tristate output connected to the normal data path and actuated by addressing with the stored digital data, and an additional circuit part in the form of another decoder connected in the normal data path between the memory matrix and said tristate output with an output connected to said tristate output, said other decoder blocking the normal data path from the memory matrix to said tristate output upon addressing each row or column of the portion of the memory matrix intended for normal operation replaced by a redundant row or column and upon simultaneous external activation of said decoder, and said other decoder indicating the insertion of a redundant row or column in place of a row or column in the portion of the memory matrix intended for normal operation with the appearance of a uniform indicating signal as said data output.

Thus, for a dynamic memory constructed in the usual manner as such, it is possible to render the addresses of defective word lines and of defective bit lines recognizable by a logic level at the data output of the memory, with an auxiliary decoder constructed in a suitable manner and connected to the data output of the memory.

In accordance with another feature of the invention, there are provided, means for delivering the column address pulse, the row address pulse and a write pulse to said other decoder, said other decoder being clock-controlled depending on the row address pulse for reading out addresses of defective rows, and said other decoder being clock-controlled depending on the row address pulse and the column address pulse for reading out defective columns, the write pulse arriving at said other decoder at least as early as the column address pulse.

In accordance with a further feature of the invention, a delay is present between the column address pulse and the write pulse which is small enough to insure blocking of the normal data path from the memory matrix to said data output.

In accordance with an added feature of the invention, there is provided an input of said other decoder formed of MOS field effect transistors connected to said tristate output, said at least one row decoder and said at least one column decoder being in the form of redundance decoders assigned to each of the redundant matrix rows and each of the redundant matrix columns, the redundance decoder being permanently settable for reacting to an addressing signal correlated with a defective matrix row or defective matrix column of the portion of the matrix memory intended for normal operation, and the redundance decoders activating a redundant row or column and supplying a signal controlling said tristate driver through said other decoder only in the presence of an externally triggerable activated state of said input formed of MOS field effect transistors.

In accordance with an additional feature of the invention, said input of said other decoder includes respective first MOS field effect transistors having gate terminals fixedly connected to outputs of the respective row and column redundance decoders, drain terminals connected to a supply potential, and source terminals, respective clock-controlled second MOS field effect transistors connected between said source terminals of said respective first MOS-FETs and a reference potential, and respective clock-controlled third transfer transistors connected between said respective second MOS-FETs and said tristate output.

In accordance with yet another feature of the invention, all of said first MOS-FETs connected to each of the row redundance decoders are directly mutually interconnected by said source terminals thereof; one of said second MOS-FETs is a common MOS-FET connecting said interconnected source terminals to the reference potential and having a gate terminal controlled by a first clock signal; all of said first MOS-FETs connected to each of the column redundance decoders being directly mutually interconnected by said source terminals thereof; another of said second MOS-FETs is a common MOS-FET connecting said interconnected source terminals to the reference potential and having a gate controlled by a second clock signal; and including a fourth transfer transistor having a source terminal connected jointly to said interconnected source terminals of said first MOS-FETs connected to the row redundance decoders, a gate terminal and a drain terminal; an AND gate having an output connected to said gate terminal of said fourth transfer transistor and two inputs respectively controlled by said second and a third clock signal; a fifth transfer transistor having a source terminal connected jointly to said interconnected source terminals of said first MOS-FETs connected to the column redundance decoders, a gate terminal controlled by a fourth clock signal and a drain terminal connected to said drain terminal of said fourth transfer transistor; said tristate output being in the form of two output MOS-FETs having gate terminals controlled by the digital data from the memory matrix; said third transfer transistors having gate terminals controlled by said third clock signal; one of said third transfer transistors being connected between said interconnected drain terminals of said fourth and fifth transfer transistors and said gate terminal of one of said two output MOS-FETs; said one output MOS-FET being connected to the supply potential; and an inverter connected to said interconnected drain terminals of said fourth and fifth transfer transistors and in series with another of said third transfer transistors which is in turn connected to said gate terminal of said other of said two output MOS-FETs.

In accordance with yet an added feature of the invention, there is provided a clock-controlled output driver connected between the matrix memory and said gate terminals of said output MOS-FETs for receiving information from the memory matrix and delivering the digital data to said one output MOS-FET as a direct data signal and to said other output MOS-FET as an inverted data signal; a first discharge transistor having a source-drain path connected between said gate of said one output transistor and the reference potential, and a gate terminal; a second discharge transistor having a source-drain path connected between said other output transistor and the reference potential, and a gate terminal; another AND gate having an output connected to said gate terminals of said discharge transistors, an input controlled by the column address pulse, and another input; and another inverter connected between said third clock signal and said other input of said other AND gate.

In accordance with yet a further feature of the invention, there is provided a circuit for generating said third clock signal for said AND gate and said third transfer transistors, including first and second AND gates each having first and second inputs and an output, a third AND gate having first, second and third inputs and an output delivering said third clock signal, first, second, third and fourth delay elements each having an input and an output, a Schmitt trigger connected to said third input of said third AND gate, said Schmitt trigger receiving an input signal differing from a normal input level for actuating said Schmitt trigger, and another inverter having an input receiving the row address stroke and an output connected to said input of said first delay element as well as to said first inputs of said first, second and third AND gates, said output of said first delay element being connected to said second input of said first AND gate, said input of said second delay element being connected to said output of said first AND gate, said output of said second delay element being connected to said second input of said second AND gate, said input of said third delay element being connected to said output of said second AND gate, said output of third delay element being connected to said input of said fourth delay element, and said output of said fourth delay element being connected to said second input of said third AND gate.

In accordance with yet an additional feature of the invention, said circuit is part of a pulse shaper including another circuit for generating said second clock-signal for controlling said other second MOS-FET, including a further inverter having an output delivering said second clock signal and an input, a fourth AND gate having an output connected to said input of said further inverter, a first input connected to said output of said second AND gate and a second input, and an additional inverter having an input receiving the column address stroke and an output connected to said second input of said fourth AND gate.

In accordance with still another feature of the invention, there is provided a fifth delay element having an input connected to said output of said fourth AND gate and an output, and a fifth AND gate having a first input directly connected to said output of said fourth AND gate, a second input connected to said output of said fifth delay element, and an output delivering said fourth clock signal for controlling said gate of said fifth transfer transistor.

In accordance with still an added feature of the invention, there is provided a clock-controlled output driver connected between the matrix memory and said gate terminals of said output MOS-FETs, said pulse shaper forming clock pulses from the column address pulse and the row address pulse for controlling said output driver.

In accordance with yet a further feature of the invention, said delay elements are adjusted to the same transit time.

In accordance with yet an additional feature of the invention, there are provided RS flip-flops each being connected between a respective one of said second MOS-FETs and a respective one of said output MOS-FETs, said inverter being in the form of two series-connected pairs of transistors and a capacitor connected thereto.

In accordance with a concomitant feature of the invention, said AND gate includes a MOS field effect transistor.

Other features which are considered as characteristic for the invention are set forth in the appended claims.

Although the invention is illustrated and described herein as embodied in an integrated dynamic write-read memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings, in which:

Figure 1:
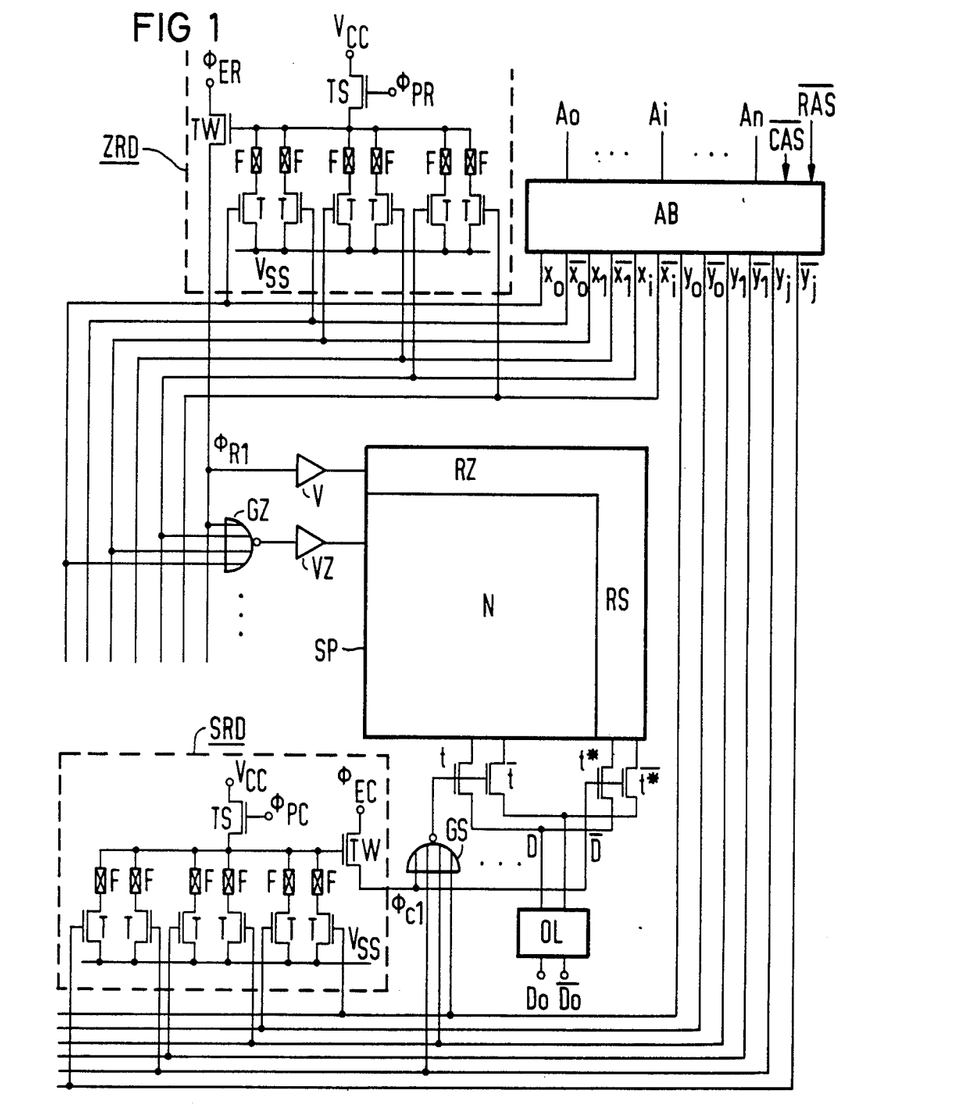
FIG. 1 is a schematic and block circuit diagram of an ordinary dynamic RAM memory to which the present invention is applicable.

Referring now to the figures of the drawing in detail and first particularly to FIG. 1 thereof, there is seen a DRAM memory provided with redundant rows and columns, using a control circuit as shown in the Publication "1981 IEEE International Solid State Circuits Conference", pp. 84 and 85, FIG. 3. However, as compared with this publication, the DRAM memory is illustrated in even greater detail in FIG. 1 of the application. A memory matrix SP is shown in FIG. 1, having a cell field area N intended for normal operation, an area RZ of redundant rows, and an area RS of redundant columns. Address inputs $A_o$, $A_l$, $—A_n$ actuate an address buffer AB which is controlled by a column address pulse or select $\overline{CAS}$ as well as by a row address pulse or select $\overline{RAS}$ and is constructed as a demultiplexer. The demultiplexer has outputs $x_i$ and $\bar{x}_i$, respectively, (wherein i=0, 1, 2, ...) that are responsible for addressing by matrix rows, and outputs $y_j$ and $\bar{y}_j$, respectively (wherein j=0, 1, 2, ...) for addressing by matrix columns. To begin with, this is only for the cell field area N intended for normal operation. To this end, two addressing outputs for row control (two outputs $x_i$, $\bar{x}_i$) and two addressing outputs for column control (two outputs $y_j$, $\bar{y}_j$) are combined as a pair, in that they carry mutually inverted addressing signals.

The output pairs $x_o$, $\bar{x}_o$ ... $x_n$, $\bar{x}_n$ intended for addressing according to the rows of the portion N of the memory matrix SP intended for normal operation, which may be a square portion, are connected to n inputs of NOR gates GZ correlated with the individual matrix rows, in such a way that exactly one of the matrix rows in the area N of the memory matrix SP is activated by the output of the respective NOR gate GZ using an amplifier V, for each possible combination of signals at the address inputs $A_o$, ... $A_n$ of the address buffer AB.

The outputs $y_j$, $\bar{y}_j$ of the address buffer AB intended for addressing according to the columns of the portion N of the memory matrix intended for normal operation, are all likewise intended for the control of NOR gates GS. Such a NOR gate GS is assigned to the individual matrix columns and therefore to bit lines in the cell field area N of the memory matrix SP intended for normal operation. However, the drive of the columns of the cell field area N by the NOR gates GS is somewhat different from the drive of the matrix rows by the NOR gates GZ.

This is due to the fact that the memory cells and comparison cells of the memory matrix SP are formed as identical single transistor memory cells. The cells belonging to one matrix row are connected by the gate of their transistor to the word line correlated with the respective matrix row. The situation is different with respect to the column lines, that is, the bit lines. Each of these bit lines as seen, for instance, in the Publication "1976 IEEE International Solid State Circuits Conference", pp. 128 and 129) is divided into two halves, which in each instance comprise one half of the memory cells provided per matrix column and one comparison cell (dummy cell) for each, and are connected to the current-carrying terminal of the switching transistor of the respecitve cell away from the memory capacitance of the respective cell. Meanwhile, the other current-carrying terminal of the switching transistor is connected to the memory capacitance referred to a reference potential. Each of the two bit line halves is connected by one end thereof to one of the two signal pins of the write-read amplifier of the respective matrix column constructed as a flip-flop, while the addressing takes place at the other end thereof.

For this reason, modifications seen in FIG. 1 have been made concerning the connection of the NOR gates GS for addressing by matrix columns in comparison to the NOR gates GZ for addressing by matrix rows. The output of each of these NOR gates GS controls the gates of two MOS field effect transistors t, $\bar{t}$. One current-carrying terminal (the source) of each of the MOS-FETs t, $\bar{t}$ is connected to one of the two information-carrying terminals of the write-read amplifier connected with one bit line half of the associated matrix column, which is associated with the matrix column to be addressed by the respective NOR gate GS. The other current-carrying terminal (the drain) of one of these two MOS-FETs, i.e. of transistor t, is connected to a data output D carrying a non-inverted output signal, and the other current-carrying terminal of the other MOS-FET $\bar{t}$ is connected to a data output $\bar{D}$ of the memory matrix carrying an inverted output signal. Since the memory matrix SP contains redundant rows and columns which are constructed in the same way as the columns and rows provided in the area A of the memory matrix SP and since these must replace a defective row or column of the normal area N if needed, even more circuit parts are provided for this purpose. These other circuit parts form at least one row redundance decoder ZRD and column redundance decoder SRD, respectively.

For each of the row redundance decoders ZRD, a MOS field effect transistor T is associated with each of the address outputs $x_i$, $\bar{x}_i$ of the address buffer AB for addressing by matrix rows, due to the fact that the gate of the MOS-FET T is connected with the respective address output of the address buffer AB. All of the source terminals of these transistors T are applied to a reference potential $V_{ss}$ and the drains thereof are jointly connected through an interruptible connection F for each transistor to the source terminal of an additional MOS field effect transistor TS controlled by a clock signal $\phi_{PR}$. The drain terminal of the transistor TS is connected to a first supply potential $V_{cc}$, while the source terminal thereof is connected not only to the interruptible connection F but also to the gate of a further MOS field effect transistor TW. The source terminal of this further transistor TW is intended to be used to control an additional input of each of the NOR gates GZ provided for row selection.

To this end, the drain terminal of the further transistor TW is actuated by a clock-controlled drain potential signal $\phi_{ER}$. Finally, the source terminal of the further transistor TW is connected on one hand to one input of each of the NOR gates GZ responsible for the control of the individual word lines and hence for addressing by rows in the normal cell field area N as mentioned above. On the other hand, the source of the transistor TW is also connected through the amplifier V to a redundant word line for each row in the supplementary area RZ of the memory cell matrix SP. Each of the redundant rows and hence word lines which are provided is connected in the manner seen in FIG. 1 with a respective row redundance decoder ZRD, the row redundance decoders ZRD being identical with respect to their wiring. The clock signals $\phi_{ER}$ for control of the drain terminal of the transistors TW and the clock signals $\phi_{PR}$ for control of the gate of the transistor TS are common to all row redundance decoders ZRD of the memory.

As can easily be seen, each of the word lines intended for normal operation, that is, each word line in the cell field area N, is actuated with a level "1" when and only when a "0" is present at all of the inputs of the respective NOR gate GZ. Due to the above-mentioned facts, this will only be the case for a single specific combination of the signals at the outputs $x_i$, $\bar{x}_i$ of the address buffer AB on the basis of the possible addressing. Besides this fact, all of the interruptible connections F in the particular redundance decoder ZRD assigned to a particular redundant row in the cell field area RZ must then be in order.

If a matrix row in the cell field area N is to be replaced by a redundant row, the redundance decoder ZRD assigned to the respective redundant row must be programmed and fixed by interruption of connections F. This is to be done in such a way that when the row-address combination correlated with the respective row in the cell field area N occurs at the outputs $x_i$, $\bar{x}_i$ of the address buffer AB, the NOR gate GZ assigned to this row in the cell field area N will be blocked. The transistor TW in the row redundance decoder correlated with the redundant row will instead switch the clock pulse $\phi_{ER}$ through to the word line in the cell field area RZ correlated with the redundant row. Further details will be given below, since this operation is correlated with the addressing of redundant matrix columns. However, the connecting-in of the column addressing will first be discussed briefly.

As mentioned above, each matrix column in the cell field area N provided for normal operation is also assigned to a NOR gate GS acting as a column address decoder; the inputs of the NOR gates GS are actuated by the address outputs $y_j$, $\bar{y}_j$ for column addressing in such a way that a "1" always appears at the output of the NOR gate GS assigned to the respective matrix column, only for an address combination which is only correlated with the particular matrix column. This "1" then serves for addressing the respective matrix column in the cell field area N. Since dynamic memories with single transistor memory cells have a bit line formed of two halves, each of which are connected to one of the two signnal terminals of the previously mentioned write-read amplifier, the two parts must be addressed separately. For this reason, the two signal terminals of the write-read amplifier assigned to the individual matrix columns are connected to one of the two data outputs D, $\bar{D}$ through the source-drain path of a transistor t, $\bar{t}$, respectively. The gates of these two transistors t, $\bar{t}$ assigned to the respective matrix column are actuated and controlled by the output of the NOR gate GS assigned to the respective matrix column. This fact has already been noted above.

Each redundant matrix column in the area RS has just such a MOS transistor pair t*, t̄* assigned to it. The transistors of this pair are connected to the respective matrix column in the same manner as the transistors t and t̄. However, the signal which drives the respective MOS transistor pair t*, t̄* is not supplied by a NOR gate GS, but by the output of the column redundance decoder SRD assigned to the respective redundant matrix column only. This means that each of the redundant matrix columns is combined with a column redundance decoder SRD assigned thereto.

With respect to construction, the column redundance decoders SRD in FIG. 1 are identical with the row redundance decoders ZRD, so that identical reference symbols have been used in both cases. The transistor TS which forms the connection of the gate of the further output transistor TW with the supply potential $V_{cc}$, is jointly controlled in all of the column redundance decoders SRD by a clock signal $\phi_{PC}$. As is evident from FIG. 2, the signal $\phi_{PC}$ differs in time from the corresponding clock signal $\phi_{PR}$ in the row redundance decoders ZRD. The same applies for the clock pulse signal $\phi_{EC}$ which jointly actuates the drain terminal of the further or output transistor TW in the column redundance decoders SRD in all of these decoders, with respect to the corresponding clock signal $\phi_{ER}$ in the row redundance decoders ZRD. Finally, it should also be noted that the decoder outputs formed by the source terminal of the further or output transistor TW of the individual column redundance decoders SRD, are each connected to one input of all of the NOR gates GS responsible for column addressing.

Figure 2:
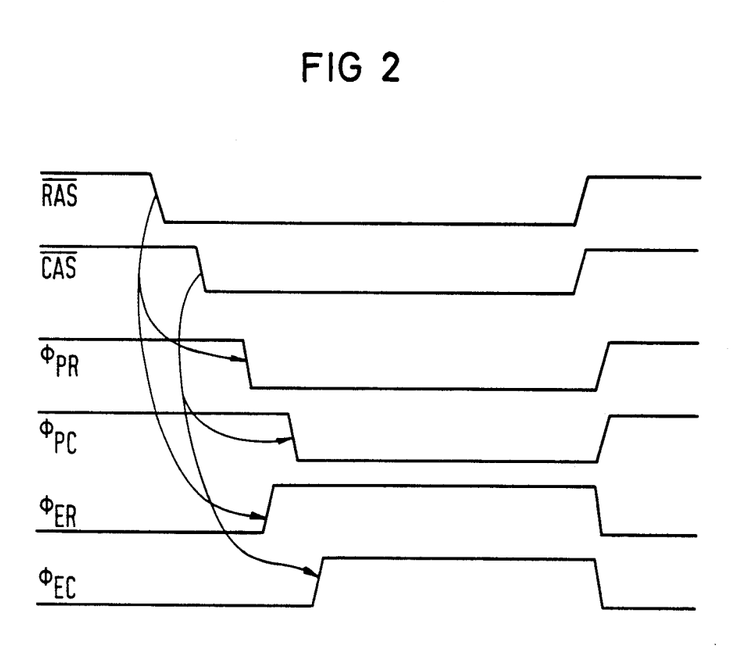
FIG. 2 is a graph giving the respective clock control time diagram.

The time diagrams of the clock signals required for the operation of a DRAM memory according to FIG. 1 are illustrated in FIG. 2.

The replacement of a matrix column intended for normal operation in the cell field area N by an available redundant column, is analogous to replacement of matrix rows by a redundant row. In order to replace a matrix column it is necessary to adjust the redundance decoder correlated with the respective matrix column by an interruption of the connections F. This is done in such a way, that when addressing the column to be replaced in the cell field area N responsible for normal operation, one of the column redundance decoders SRD responds and supplies a signal $\phi_{cj}$ which activates a redundant column and simultaneously deactivates all other columns of the normal memory matrix N and hence the defective columns as well. It should also be determined that the two data outputs D and $\overline{D}$ of the memory are preferably connected through an output driver OL to a tristate output, as has been described in greater detail in copending U.S. application Ser. No. 549,582, filed Nov. 7, 1983. In FIG. 1 and in other figures, the data outputs of the output driver OL are indicated with reference symbols Do and $\overline{Do}$, respectively.

Figure 3:
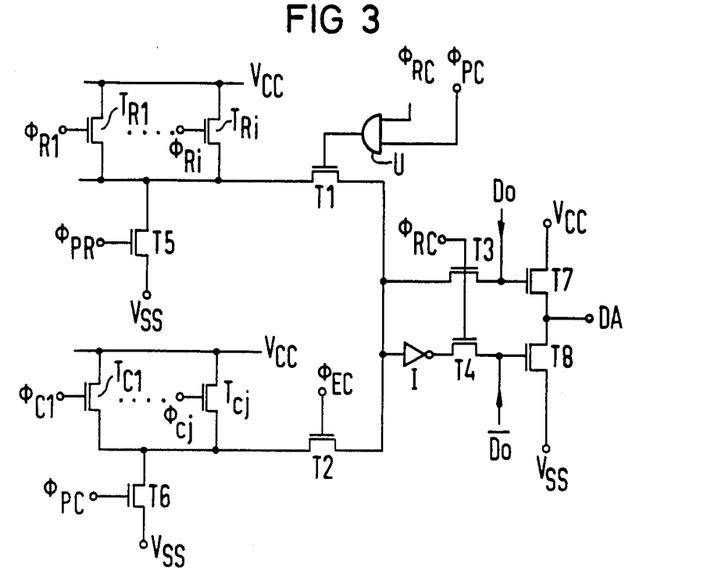
FIG. 3 is a circuit wiring diagram for a decoder according to the invention.

In order to further develop the conventional DRAM memory shown in FIG. 1 in accordance with the present invention, the data output constructed as a tristate output is influenced by the output of a further circuit part constructed as a decoder, according to the definition of the present invention. This further circuit part is constructed in such a way that it acts as a roll call decoder. Advantageously, the structure of the roll call decoder is as indicated in FIG. 3. Since the tristate output to be controlled is also passed through by the data to be taken from the memory, it is appropriate to connect the tristate output to the data output buffer OL of the memory in the manner seen in FIG. 3a.

Figure 4:
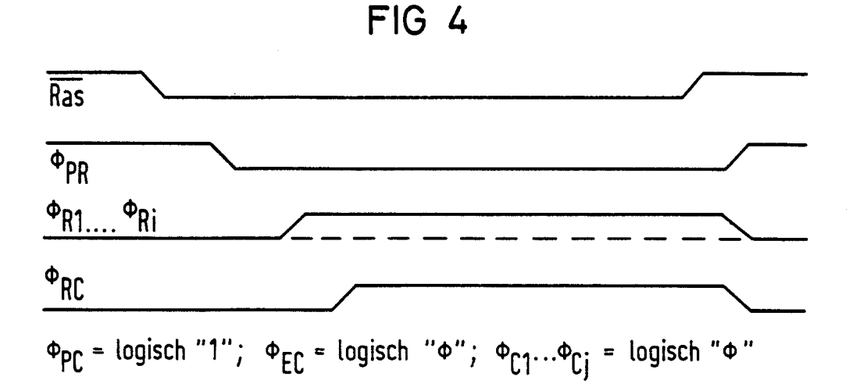
FIG. 4 is a graph giving the time diagram of the pulses required for operating the decoder of FIG. 3.
Figure 5:
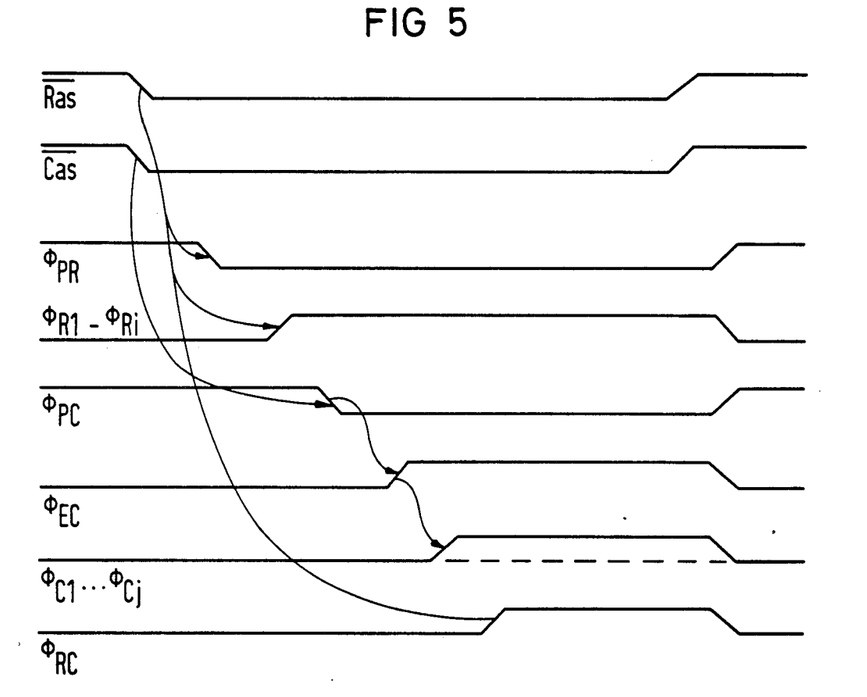
FIG. 5 is a graph of the time diagram of the pulses to be used for the roll call in an Early Write mode.
Figure 6:
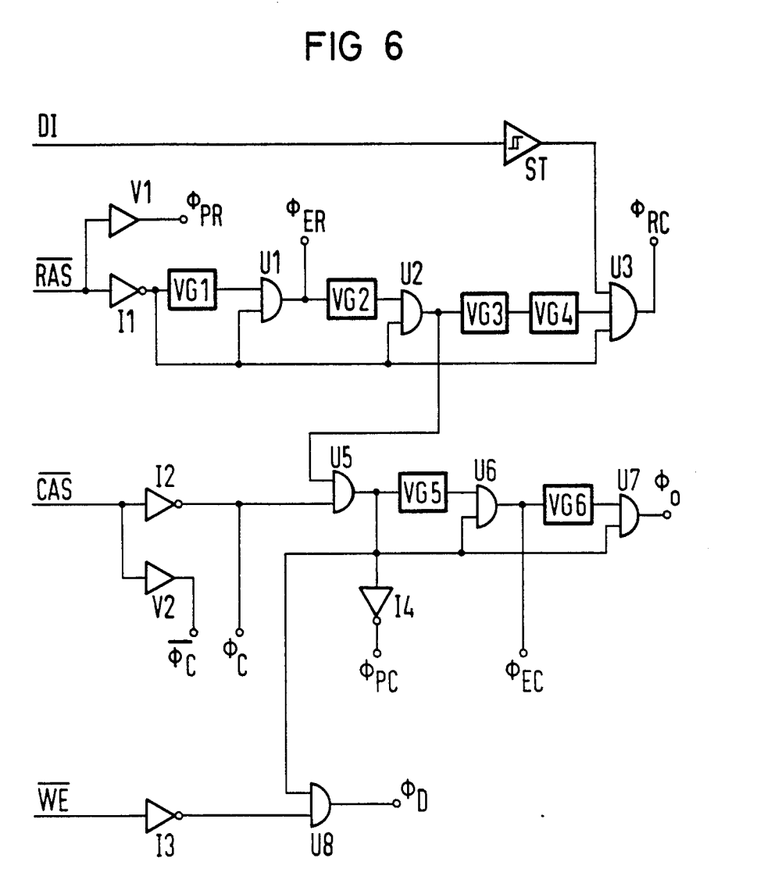
FIG. 6 is a schematic and block circuit diagram of a clock transformer which supplies the pulses required for the operation of a system according to the invention and which is controlled by pulses $\overline{RAS}$, $\overline{CAS}$ and $\overline{WE}$ (write clock pulse), that is, by the pulses customary in dynamic RAM memories.
Figure 7:
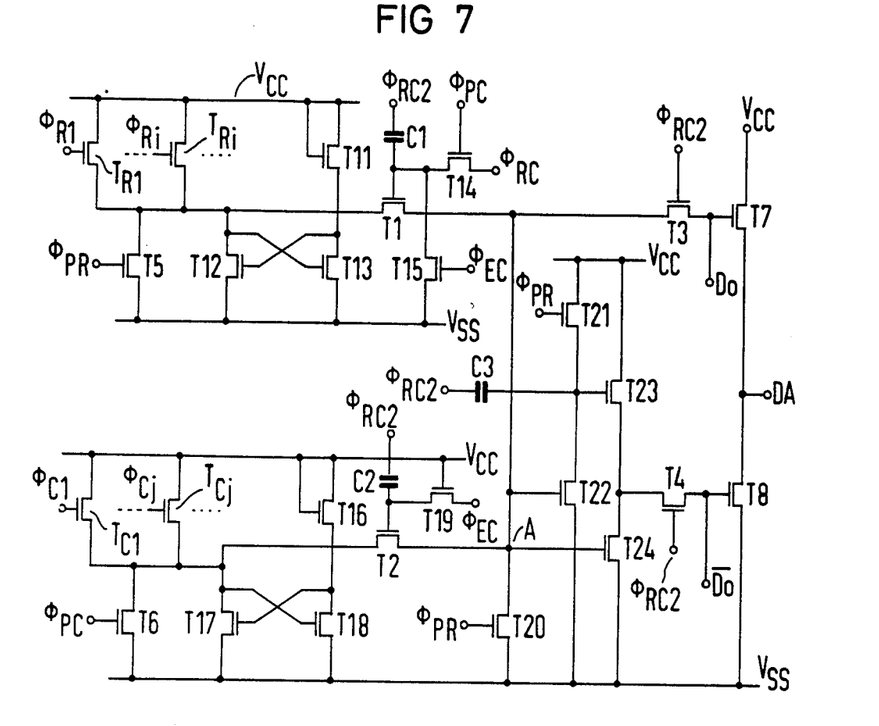
FIG. 7 is a schematic circuit diagram of a further embodiment of the output decoder constituting the core of the invention.
Figure 7A:
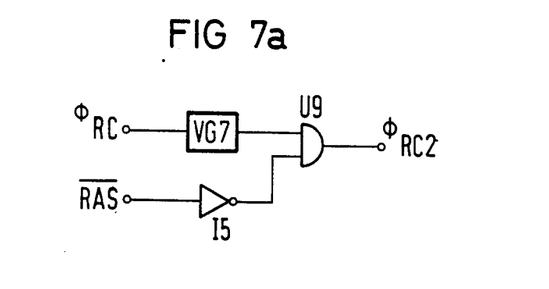
FIG. 7a is a schematic and block circuit diagram of another circuit for supplying clock signals.

FIG. 4 and FIG. 5 show the clock pulses in time diagram required for two operational modes of the roll call decoder shown in FIG. 3, while FIG. 6 shows a circuit diagram of a system that is suitable for generating the pulses required for the operation of the roll call decoder according to FIG. 3. The subject of FIG. 7 is a representation of the roll call decoder of the invention, which differs somewhat from the embodiment of FIG. 3 and is likewise shown in MOS technology. The subject of FIG. 7a is the supplementation of a pulse shaper according to FIG. 6 required for this purpose. It is only the generation of the pulses $\overline{RAS}$, $\overline{CAS}$ and $\overline{WE}$ which is not illustrated in the drawings, since various systems for this purpose are known.

The circuit shown in FIG. 3 provides a so-called roll call decoder, because the mode of operation of a DRAM memory according to FIG. 1 which is made possible with the aid of the circuit of FIG. 3, complies with the roll call mode known in the art(as described in the publication: Electronics/Mar. 24, 1982, pp. 121-124). Although the prior art device involves the use of this mode in a static RAM and the operation is adapted therein exclusively as a memory which had redundant bit lines, no redundant word lines are provided and moreover the addresses are not multiplexed. In the present invention, these limitations are to be eliminated.

The roll call decoder illustrated in FIG. 3 (as well as the rest of the memory circuit), is constructed with the aid of self-locking MOS field effect transistors of the same channel type, so that integration with the other parts of the memory, in particular with the required pulse shaper system shown in FIG. 6, presents no particular technological difficulties. In the interest of attaining a higher switching speed, the use of n-channel MOS-FET's is more favorable for the construction of the device than the use of p-channel MOS-FETs. The circuit diagrams and the voltages given are therefore geared to the use of n-channel MOS-FETs.

For the purpose of controlling the decoder according to the present invention shown in FIG. 3, initially the signal output Do which delivers the data signal to be evaluated is provided for controlling a first output transistor T7, and the data output $\overline{Do}$ which delivers the inverted output signal, is provided for controlling a second output transistor T8. The drain terminal of the first transistor T7 which is controlled by the direct output Do of the memory according to FIG. 1, is connected to the first supply potential $V_{cc}$ and its source perminal is connected to the signal output terminal DA of the DRAM memory. The source terminal of the second transistor T8, which is controlled by the inverted output data signal and hence by the output $\overline{Do}$ of the memory, is connected to the signal output terminal DA, so that the two output transistors T7 and T8 are connected in series, with respect to their source-drain paths. Since the two output transistors are of the same channel type, they form a so-called tristate output, which is controlled in the usual manner by the output driver OL of the memory circuit shown in FIG. 1 for a dynamic integrated semiconductor memory.

Figure 3A:
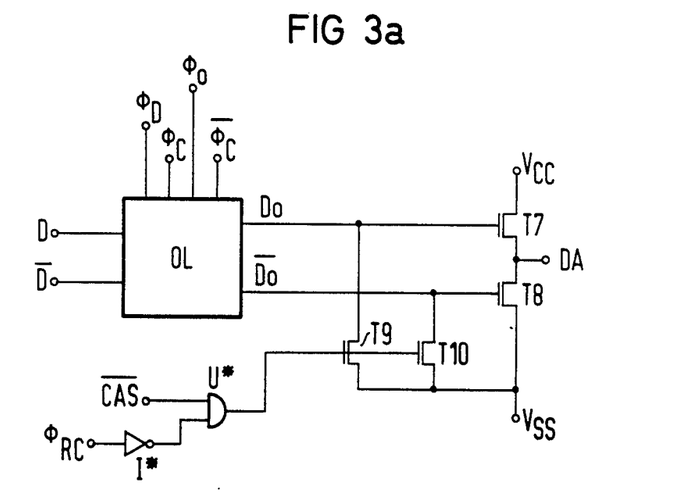
FIG. 3a is a data output circuit diagram of the memory to be used for normal operation and likewise switched to the tristate output.

The type of actuation seen in FIG. 3a is especially recommended for this type of device. An additional control of the tristate output T7, T8 dependent on the operational state of redundant rows and columns, is also essential to the invention.

As has been explained before, each of the redundant rows provided in the memory matrix SP has a row redundance decoder ZRD assigned thereto. The output of the respective row redundance decoder ZRD is provided by the source terminal of the further transistor TW of these redundance decoders ZRD, which is actuated at the drain terminal thereof by the clock signal $\phi_{ER}$ that is common to all of the row redundance decoders of the circuit. Due to interruption of the interruptible connections F in the respective decoder, this output carries a signal $\phi_{Ri}$ programmed on the basis of the interruption. As is evident from FIG. 1, this signal $\phi_{Ri}$ is used for addressing the $i^{th}$ redundant word line belonging to the $i^{th}$ row redundance decoder $ZRD_i$ in the RZ area of the memory matrix SP. In addition it is also used for controlling a transistor $T_{Ri}$ in the roll call decoder of FIG. 3.

The drain terminals of transistors $T_{Ri}$ controlled by the redundance decoders $ZRD_i$ (i=1, 2, . . . ) are connected to the first supply potential $V_{cc}$ and the source terminals thereof are jointly connected to the drain terminal of an additional MOS-FET T5, which forms the connection to the reference potential $V_{ss}$ and can be controlled by the same clock signal $\phi_{PR}$ that is also present at the gate of the MOS-FET TS forming the connection to the supply potential $V_{cc}$ in the individual row redundance decoders ZRD. The common node present between the transistor $T_{Ri}$ and the transistor T5 is provided for the control of the tristate output T7, T8 through the source-drain path of another MOS-FET T1. It should be noted at this point that the gate of this additional MOS-FET T1 is controlled by the output of an AND gate U, which in turn is controlled by two clock signal sequences $\phi_{RC}$ and $\phi_{RC}$ and $\phi_{PC}$. The clock signal sequence $\phi_{PC}$ is the same signal which controls the gate of the common MOS-FET TS of the column redundance decoders $SRD_j$ (j=1, 2, . . .) forming the connection of the interruption points F provided in the respective column redundance decoders to the first supply potential $V_{cc}$.

On the other hand, the other pulse or signal sequence $\phi_{RC}$ intended for control of the AND gate U, is not used in the circuit shown in FIG. 1. However, it is necessary for the operation of the roll call decoder according to FIG. 3 and has been given the time response seen in FIGS. 4 and 5, respectively. The drain terminal of the transistor T1 which is controlled by the AND gate U, is connected with the drain terminal of a further MOS-FET T2 for the joint control of the tristate output, through a circuit part yet to be described.

Just as each of the individual row redundance decoders $ZRD_i$ have a MOS-FET $T_{Ri}$ assigned thereto, each of the column redundance decoders $SRD_j$ has a MOS-FET $T_{Cj}$ (j=1, 2, . . . ) assigned thereto, which is supplied by the signal output from the source terminal of the output transistor TW of the respective redundance decoder $SRD_j$. The drain terminals of the transistors $T_{Cj}$ are connected to the first supply potential $V_{cc}$. The source terminals of these transistors $T_{Cj}$ in turn form a common node. On one hand, the node is connected through the source-drain path of the above-mentioned MOS-FET T2 to the drain of the MOS-FET T1 controlled by the AND gate U. On the other hand, the node is connectible to the reference potential $V_{ss}$ through the source-drain path of an additional MOS-FET T6. For this purpose, the gate of the connecting transistor T6 is controlled by the same clock pulse sequence $\phi_{PC}$ which is responsible for the control of the MOS transistor TS that establishes the connection of the interruptible junctions F to the first supply potential $V_{cc}$ provided for programming the respective redundance decoder $SRD_j$. In order to control the additional transistor T2, the gate thereof receives a clock pulse sequence $\phi_{EC}$ which is also connected to the drain terminal of the transistor TW in the individual column redundance decoders $SRD_j$.

In order to control the tristate output T7, T8 of the roll call decoder according to FIG. 3, the drain terminals of the two transistors T1 and T2 are jointly connected through the source-drain path of a transfer transistor T3 to the gate terminal of the transistor T7 of the tristate output T7, T8, which is connected to the first supply potential $V_{cc}$. In addition, in order to control the transistor T8 of the tristate output, which is connected to the reference potential $V_{ss}$, another transfer transistor T4 is provided, which connects the drain terminals of the two transistors T1 and T2 to the gate of the transistor which is connected to the reference potential $V_{ss}$. In the embodiment illustrated in the drawing, the connection between the drain terminals of the two transistors T1 and T2 to the transfer transistor T4 is established through an inverter I. As an alternative to the embodiment shown in FIG. 3, this inverter could be provided in the path between the transistors T1 and T2 and the transistor T7 of the tristate output T7, T8. The two transfer transistors T3 and T4 are jointly controlled by the clock signal $\phi_{RC}$ already provided for the actuation of the AND gate U. The AND gate may be provided in the form of a self-locking MOS-FET having source and gate terminals which are each operated as a signal input, the drain terminal thereof is operated as the signal output of the AND gate U.

Through the use of the decoder circuit according to the invention as shown in FIG. 3, and through the use of the respective control pulses shown in FIG. 4 and FIG. 5, respectively, it is possible to recognize the addresses both of defective word lines and of defective bit lines of a RAM memory with dynamic periphery and with address multiplexing, by a logic level at the output DA of the tristate transistor combination T7, T8.

The time diagram according to FIG. 4 illustrates the time response of the pulses $\overline{RAS}$, and $\phi_{PR}$, $\phi_{Ri}$ and $\phi_{RC}$ required for the actuation of the decoder of FIG. 3, for operation serving exclusively for addressing by word lines, in the so-called Only-RAS mode. The time diagram according to FIG. 5 illustrates the time response of the pulses $\overline{RAS}$, $\overline{CAS}$, $\phi_{PR}$, $\phi_{Ri}$, $\phi_{PC}$, $\phi_{EC}$, $\phi_{Cj}$ and $\phi_{RC}$ needed for actuation of the decoder in the mode for addressing bit lines, the so-called Early-Write mode. These pulses are to be used in the manner which is seen in FIGS. 1, 3 and 3a, respectively. A system which serves the purpose of generating these pulses will be described with reference to FIG. 6.

Since the two transistors T7 and T8 are also controlled by one of the two data outputs Do or $\overline{Do}$ of the output driver OL, it is advisable to connect the output of the output driver OL shown in FIG. 1 to the tristate output DA formed by the two transistors T7 and T8 in the manner shown in FIG. 3a. Although in principle it would be possible to dispense with a combination of the data output and the output of the roll call decoder, such a combination is advisable for several reasons. One of the most important reasons is the saving of external connecting electrodes, that is, pins or terminals.

With regard to FIG. 3a it should be noted in the first place that the data information output D supplied by the memory SP and the inverted information output $\overline{D}$ are connected to the output buffer or driver OL, which in turn is actuated by four different types of clock pulses, namely the pulses $\phi_o$, $\phi_D$, $\phi_C$ and $\overline{\phi}_C$. Concerning a suitable circuit for the output driver OL, reference can again be made to the previously-mentioned U.S. Application Ser. No. 549,582 (FIG. 5b), in which the clock pulses $\phi_C$, $\phi_o$ and $\overline{\phi}_C$ are used for the control of the output driver OL and in which the function of these pulses is described. The clock pulse $\phi_D$ is likewise customary in such circuits and carries out the task of preventing the data present at the data outputs D, $\overline{D}$ from being connected through to the outputs Do, $\overline{Do}$ of the buffer or driver OL in the Early-Write mode.

The data at the data outputs Do, $\overline{Do}$ of the output buffer or driver OL are present at the gate of one of the two transistors T7, T8 forming the tristate output DA. The transistor has a drain terminal which is connected to the first supply potential $V_{cc}$ being controlled by the output Do supplying the normal data signal, and the transistor T8 has a source terminal connected to the reference potential $V_{ss}$, being controlled by the output $\overline{Do}$ of the output buffer or driver OL supplying the inverted data signal. Finally, two discharge transistors T9 and T10 are connected to the output Do and output $\overline{Do}$ and are activated by a common control signal. This common control signal is supplied by the output of an AND gate U*, having one input that is actuated by the column address pulse or cycle $\overline{CAS}$ and another input, that is actuated through an inverter I*, by a clock pulse $\phi_{RC}$. As has been mentioned above, the clock pulse $\phi_{RC}$ is also needed for the clock operation of the decoder according to FIG. 3.

The following is to be noted in connection with FIG. 3a: The data output customary in dynamic RAMs includes the output buffer OL acting as an output register, which receives the read signals D and $\overline{D}$ originating from the memory matrix and forwards them in an amplified condition to the gates of the transistors T7 and T8 of the tristate output. However, a control derived from the memory clock signals $\overline{CAS}$ (column address pulse or cycle) and $\overline{WE}$ (write enable pulse) and given by the clock pulses $\phi_o$, $\phi_C$, $\overline{\phi}_C$ and $\phi_D$ ensures that this forwarding is omitted for the modes Only-RAS (see the publication: "Electronic Design" 13, June 21, 1979, pp. 58–61, in particular p. 61) and Early-Write (see the publication: "Electronics", April 28, 1977, pp. 115–119, in particular p. 116) and that the data output DA remains in the tristate state.

According to the invention, it is supposed to be possible for the clock pulse $\phi_{RC}$ to assume the value logic "1" only when the roll call mode exists, in other words when the decoder shown in FIG. 3 that works on the tristate output T7 and T8, is activated. This can be achieved without an additional terminal of the memory component. For example, the clock pulse $\phi_{RC}$ may be enabled only when a Schmitt trigger(seen in FIG. 6) registers an input level differing from the normal mode at the data input terminal. The clock pulse $\phi_{RC}$ can be used in addition to inactivate any existing data output killers or discharge transistors T9 and T10 controlled by the column address pulse or cycle $\overline{CAS}$ (seen in FIG. 3a).

Based on the circuit structure according to the invention, the mode of operation of the decoder of FIG. 3 is such that upon roll call in the Only-RAS mode (that is, when using the pulses according to FIG. 4) with a word address applied accordingly, a logic "1" appears at the data output DA when the word line of the cell field area N belonging to the respective word address (referred to the cell field area N) has been replaced by a redundant word line from the area RZ.

During roll call in the Early-Write mode (i.e. when using the clock pulses shown in FIG. 5), a logic "1" appears at the data output DA of the tristate output T7, T8 when the bit line belonging to the bit address in the cell field area N provided for formal operation has been replaced by a redundant bit line (i.e. a bit line from area RS of the memory matrix SP), with the bit address applied. The transfer of the roll call decoding signal to the data output DA occurs through the transfer gates, i.e. the transistors T3, T4, which are opened by the clock pulse $\phi_{RC}$.

In order to read out the redundant bit lines, it must be ensured that the clock pulse $\phi_{RC}$ comes after the corresponding clock pulse $\phi_{PC}$, to prevent a logic "1" from passing through the transfer transistor T1 controlled by the AND gate U and reaching the point determining the control of the tristate output, that is, the drain of transistor T1. The particular connected word address is of no importance for reading out the redundant bit lines.

The pulses $\phi_{Cj}$ supplied by the individual column redundance decoders $SRD_j$ reach the value logic "1" only when a redundant bit line is addressed through the individual bit redundance decoders (column redundance decoders SRD). This behavior is clear from FIG. 1, and the same is also true of the pulses $\phi_{Ri}$ which are supplied by the row redundance decoders to the roll call decoder shown in FIG. 3. In this case as well, a redundant word line must have been addressed through a row redundance decoder for the respective pulse $\phi_{Ri}$, i.e. a logic "1", to be sent to the roll call decoder.

As a variation from the construction according to FIGS. 3 and 3a, both the roll call decoder and the memory data output may have a tristate output composed of two transistors T7 and T8 according to FIG. 3 or 3a, in which case the two tristate outputs, which correspond to the output DA, are connected to a common output terminal. Furthermore, as has been mentioned above, each of the two tristate outputs may have an output pin or terminal assigned thereto Both in the case described with reference to FIGS. 3 and 3a and when using a single terminal for two tristate outputs (one of which belongs to the roll call decoder and the other to the output driver OL), the data signal originating from the memory matrix SP must be prevented from influencing the logic level at the common output terminal in the roll call mode of operation. In the construction illustrated in FIGS. 3 and 3a this has been achieved by the clock control. If a charge killer (transistors T9, T10 of FIG. 3a) is provided, it must be switched off by the clock pulse $\phi_{RC}$.

The clock pulses $\phi_{PR}$ and $\phi_{Ri}$ are dependent on the row address pulse or cycle $\overline{RAS}$, and the clock pulses $\phi_{PC}$, $\phi_{EC}$ and $\phi_{Cj}$ are dependent on the column address pulse or cycle $\overline{CAS}$, and then enabled in the Early-CAS mode by a $\overline{RAS}$ pulse.

In the pulse conversion system shown in FIG. 6 an input is controlled by the row address pulse or cycle $\overline{RAS}$ and delivers the pulse $\phi_{PR}$ required for control of the transistor T5 (FIG. 3) or TS (FIG. 1), through an amplifier V1. In addition, the $\overline{RAS}$ pulse controls an inverter I1, having an output which is connected directly to one input of a first AND gate U1 and through a first delay element VG1 to the other input of the first AND gate U1. In addition, the output of the first inverter I1 controls one input of each of two additional AND gates U2 and U3.

The output of the AND gate U1 supplies the pulses $\phi_{ER}$, which in turn are applied to the drain terminal of output transistor TW in the row redundance decoders $ZRD_i$, and which lead to the behavior of these decoders described with reference to FIG. 1. The pulse $\phi_{ER}$ is additionally sent to the input of a second delay element VG2, the output of which is provided for the control of the abovementioned second AND gate U2 together with the output of the first inverter I1. The output of the second AND gate U2 is connected through the series connection of two additional delay elements VG3 and VG4 to one input of the third AND gate U3. As mentioned before, the other input of the third AND gate U3 is actuated by the output of the first inverter I1. The third AND gate U3 also has a third control input, which is controlled by a data input signal DI through a Schmitt trigger ST, and an output which supplies the clock pulses $\phi_{RC}$. As has been stated above, the pulses $\phi_{RC}$ are needed for control of the AND gate U and of the two transfer transistors T3 and T4 in the roll call decoder according to the invention, as shown in FIG. 3.

As is seen from FIG. 6, the column address pulse or cycle $\overline{CAS}$ is also present at the input of an amplifier, having an output delivering the clock pulses $\phi_C$ needed for control of the output buffer OL. The clock pulses $\phi_C$ which are inverted with respect to these pulses $\phi_C$ and which are also needed for control of the output buffer OL, are supplied by the output of an inverter I2 having an input which is controlled by the column address pulse or cycle $\overline{CAS}$.

This second inverter I2 of the pulse shaper according to FIG. 6 also controls one input of an additional AND gate U5, having another input which is actuated by the output of the previously mentioned second AND gate U2 of the pulse shaper. The output of the fifth AND gate U5 supplies the pulses $\phi_{PC}$ through an additional inverter I4. The pulses $\phi_{PC}$ are provided for the control of the gate of transistor TS in the individual column redundance decoders $SRD_j$, for the control of the AND gate U in the decoder according to the FIG. 3 and for the control of transistor T6 in the FIG. 3 decoder. The output of the first AND gate U5 is sent through a fifth delay element VG5 to control one input of a sixth AND gate U6, having another input which is actuated with the pulses supplied directly by the output of the fifth AND gate U5. The output of the sixth AND gate U6 supplies the clock pulses $\phi_{EC}$ needed for actuation of the drain terminal of the output transistors TW in the individual column redundance decoders $SRD_j$. Finally, the output of the sixth AND gate U6 is connected to the input of a sixth delay element VG6. The output of this sixth delay element VG6 controls a seventh AND gate U7 together with the output of the fifth AND gate U5. The seventh AND gate U7 has an output which supplies the pulses $\phi_o$ that are needed for the clock control of the output buffer OL.

The already-mentioned and conventional write signal $\overline{WE}$ controls an eighth AND gate U8 through a third inverter I3, together with the output of the fifth AND gate U5. The AND gate U8 delivers the required pulse $\phi_D$ for controlling the output buffer OL.

In this connection the following should also be noted:

1. The delay elements are identical and are constructed, for example, by the series connection of two inverters. With respect to structure and rating and in particular with respect to transit time, these inverters are the same as the other inverters in the pulse shaper.

2. The amplifiers are also adjusted with respect to their transit time in such a way that this transit time is identical with the transit time in the individual inverters. An example of how to achieve this has been described in U.S. Application Ser. No. 549,582, mentioned above.

3. The pulses DI provided for the control of the Schmitt trigger ST are identical with the signals forming the information to be stored and to be applied to the data input of the memory. This means that the input of the Schmitt trigger ST is connected to the data input of the memory.

The construction of the roll call decoder shown in FIG. 3, which is at the core of the invention, can be modified somewhat in the manner seen from FIG. 7, which refers in particular to a construction in MOS technology. This can be done without any adverse affect on the operation which is the object of the invention. Concerning the description of FIG. 7, it should be noted that the parts which are identical to those in the construction according to FIG. 3 are marked with the same reference symbols as in FIG. 3. It is also clear that the roll call decoder shown in FIG. 7 is coupled with the data outputs Do and $\overline{Do}$ in the same manner as the decoder of FIG. 3.

Unlike the construction according to FIG. 3, in the case of FIG. 7 the node formed by the source terminals of the MOS-FETs $T_{Ri}$ controlled by the row redundance decoders $ZRD_i$, the drain terminal of the transistor T5 and the input of transistor T1, is connected to the drain terminal of an additional transistor T12, as well as to the gate terminal of an additional transistor T13. Both transistors T12 and T13 are connected to the reference potential $V_{ss}$ through the source terminals thereof. In addition, the gate terminal of the transistor T12 and the drain terminal of transistor T13 are connected through the source-drain path of a additional MOS-FET T11 to the first supply potential $V_{cc}$, to which the gate terminal of the transistor T11 is also connected.

In an analogous manner, the node formed by the source terminals of the transistor $T_{Cj}$ actuated by the column redundance decoders $SRD_j$ and the drain terminal of transistor T6 is connected to the drain terminal of a transistor T17 and to the gate terminal of an additional MOS-FET T18, having a source terminal which is likewise connected to the reference potential $V_{ss}$. The drain terminal of transistor T18 and the gate terminal of the transistor T17 are also connected through a transistor T16 to the first supply potential $V_{cc}$, with which the gate terminal of transistor T16 is also connected.

Due to the above-described additional circuitry of the two input parts of the roll call decoder, the source terminal of transistor T1 is connected directly with the drain terminal of the transistor T12 and the gate terminal of the transistor T13, whle the source terminal of the transistor T2 is connected to the drain terminal of the transistor T17 and to the gate terminal of the transistor T18.

In addition to the drive seen from FIG. 3, the gate terminal of the transistor T1 and the gate terminal of the transistor T2 each have an additional drive. The AND gate U provided in the form of a MOS-FET T14 has the output (the drain terminal of T14) thereof connected to the gate terminal of the transistor T1, and is moreover connected through a transistor T15 controlled by the clock pulse $\phi_{EC}$ to the reference potential. The drain terminal of the transistor T14 is also connected to a capacitor C1 which is actuated by a clock signal $\phi_{RC2}$ (not provided in the circuit of FIG. 3) which forms an additional control of the gate terminal of the transistor T1. The same clock pulse $\phi_{RC2}$ is applied through a capacitor C2 to the gate terminal of the transistor T2. In addition, the actuation of the gate terminal of the transistor T2 occurs through a transistor T19, having a gate terminal which is connected to the first supply potential and a drain terminal which is connected with the gate terminal of the transistor T2 to be controlled. The source terminal of the transistor T19 receives the clock signals $\phi_{EC}$ provided for the control of the transistor T2 in FIG. 3.

Further deviations from FIG. 3 are to be noted with respect to the drive of the two tristate output transistors T7 and T8 by a circuit node A formed by the drain terminals of the two transistors T1 and T2. Thus the pulse $\phi_{RC}$ is not used for the control of the transfer transistor T3 and of the transfer transistor T4, but instead the pulse $\phi_{RC2}$ is used. The pulse $\phi_{RC2}$ can be derived from the row address pulse or cycle $\overline{RAS}$ and the clock pulse $\phi_{RC}$ by means of an addition to the pulse shaper of FIG. 6 seen from FIG. 7a. Furthermore, the inverter I provided in FIG. 3 is replaced in the structure of FIG. 7 by a more complicated circuit structure.

In this circuit structure, a capacitor C3 is provided which is actuated by the pulse $\phi_{RC2}$ and which forwards this pulse to a node caused by three additional MOS field effect transistors T21, T22 and T23. In this transistor configuration, the transistor T21 is connected to the first supply potential $V_{cc}$ through its drain terminal and is connected to this node by its source terminal. The transistor T22 is connected by its drain terminal to this node and by its source terminal to the reference potential $V_{ss}$. The potential serving to control the gate terminal of transistor T22 is supplied by the node A, that is, by the drain terminals of the transistors T1 and T2. The node A is connected to the reference potential $V_{ss}$ through the source-drain path of a discharge transistor T20 controlled by the clock pulse $\phi_{PR}$. The gate terminal of the third transistor involved in the formation of the node, that is, the transistor T23, is directly connected to the node. Meanwhile, the drain terminal of this transistor T23 is connected to the supply potential $V_{cc}$ and the source terminal thereof is connected on one hand to the source terminal of the transfer transistor T4 leading to the transistor T8 of the tristate output and, on the other hand, through the source-drain path of an additional MOS field effect transistor T24 to the reference potential $V_{ss}$. The gate terminal of the transistor T24 is connected directly to the node A, that is, to the drain terminals of the transistors T1 and T2. As has been noted above, the control signal for the transfer transistor T4, as well as for the transfer transistor T3, is given by the clock pulse $\phi_{RC2}$ and not as in FIG. 3 by the clock pulse $\phi_{RC}$.

In order to derive the clock signal $\phi_{RC2}$ from the clock signal $\phi_{RC}$ and the pulse or cycle $\overline{RAS}$, an AND gate U9 is provided according to FIG. 7a. The output of the AND gate U9 furnishes the pulses $\phi_{RC2}$, one input thereof is controlled through an inverter I5 by the row address pulse or cycle $\overline{RAS}$, while the other input thereof is controlled by the clock pulse $\phi_{RC}$ through a delay element VG7. The supplementation of the pulse shaper of FIG. 6 which is illustrated in FIG. 7a, is constructed according to the guidelines stated for the rating of elements VG7 and I5.

The structure of the roll call decoder according to the invention illustrated in FIG. 7 has the following advantages:

The RS flip-flops T11, T12, T13 and T16, T17, T18, respectively, permit the signals at the decoder nodes to maintain a defined potential despite possible interferences, even when the transistors $T_{Ri}$ and T5 or $T_{Cj}$ and T6, respectively, are both non-conducting.

The transistors T14 and T15 form the AND gate U.

The transistors T21, T22, T23 and T24 with the capacitor C3 form the inverter I, with a bootstrap occurring at the gate of the transistor T23 by means of the capacitor C3, in order to obtain the full operating voltage $V_{cc}$ at the input of the transfer transistor T4 in the case of a logic "1".

The transistor T20 provides a defined reference potential at the node A in case neither T1 nor T2 open.

Elements C1, T14 or C2 and T19, respectively, permit a bootstrapping at the gate of the transistor T1 or T2, respectively, in order to bring the full voltage of the decoder nodes to the point A of the circuit. In the case of elements C1, T14 in particular, a clock pulse $\phi_{RC2}$ which is delayed in relation to the clock pulse is of advantage.

What is claimed:

1. In an integrated dynamic write-read memory including a memory matrix for storing digital data formed of individual identical memory cells said memory matrix having a portion intended for normal operation, and at least one redundant row and/or column initially excluded from normal operation of the memory, but available for normal operation as a replacement on the basis of addressing pulses, at least one row decoder connected to the memory matrix and at least one column decoder connected to the memory matrix for addressing with respect to the individual memory cells, means for feeding a column address pulse to the memory matrix for initiating addressing by matrix columns, means for feeding a row address pulse to the memory matrix for initiating addressing by matrix rows, and a normal data path for the stored digital data leading out of the memory matrix, the improvement comprising a data output for the memory in the form of a tristate output connected to the normal data path and actuated by addressing with the stored digital data, and an additional circuit part in the form of another decoder connected in the normal data path between the memory matrix and said tristate output with an output connected to said tristate output, said other decoder blocking the normal data path from the memory matrix to said tristate output upon addressing each row or column of the portion of the memory matrix intended for normal operation replaced by a redundant row or column and upon simultaneous external activation of said other decoder, and said other decoder indicating the insertion of a redundant row or column in place of a row or column in the portion of the memory matrix intended for normal operation with the appearance of a uniform indicating signal as said data output.

2. Device according to claim 1, including means for delivering the column address pulse, the row address pulse and a write pulse to said other decoder, said other decoder being clock-controlled depending on the row address pulse for reading out addresses of defective rows, and said other decoder being clock-controlled depending on the row address pulse and the column address pulse for reading out defective columns, the write pulse arriving at said other decoder at least as early as the column address pulse.

3. Device according to claim 2, wherein a delay is present between the column address pulse and the write pulse which is small enough to insure blocking of the normal data path from the memory matrix to said data output.

4. Device according to claim 1, including an input of said other decoder formed of MOS field effect transistors connected to said tristate output, said at least one row decoder and said at least one column decoder being in the form of redundance decoders assigned to each of the redundant matrix rows and each of the redundant matrix columns, the redundance decoder being permanently settable for reacting to an addressing signal correlated with a defective matrix row or defective matrix column of the portion of the matrix memory intended for normal operation, and the redundance decoders activating a redundant row or column and supplying a signal controlling said tristate driver through said other decoder only in the presence of an externally triggerable activated state of said input formed of MOS field effect transistors.

5. Device according to claim 4, wherein said input of said other decoder includes respective first MOS field effect transistors having gate terminals fixedly connected to outputs of the respective row and column redundance decoders, drain terminals connected to a supply potential, and source terminals, respective clock-controlled second MOS field effect transistors connected between said source terminals of said respective first MOS-FETs and a reference potential, and respective clock-controlled third transfer transistors connected between said respective second MOS-FETs and said tristate output.

6. Device according to claim 5, wherein all of said first MOS-FETs connected to each of the row redundance decoders are directly mutually interconnected by said source terminals thereof; one of said second MOS-FETs is a common MOS-FET connecting said interconnected source terminals to the reference potential and having a gate terminal controlled by a first clock signal; all of said first MOS-FETs connected to each of the column redundance decoders being directly mutually interconnected by said source terminals thereof; another of said second MOS-FETs is a common MOS-FET connecting said interconnected source terminals to the reference potential and having a gate controlled by a second clock signal; and including a fourth transfer transistor having a source terminal connected jointly to said interconnected source terminals of said first MOS-FETs connected to the row redundance decoders, a gate terminal and a drain terminal; an AND gate having an output connected to said gate terminal of said fourth transfer transistor and two inputs respectively controlled by said second and a third clock signal; a fifth transfer transistor having a source terminal connected jointly to said interconnected source terminals of said first MOS-FETs connected to the column redundance decoders, a gate terminal controlled by a fourth clock signal and a drain terminal connected to said drain terminal of said fourth transfer transistor; said tristate output being in the form of two output MOS-FETs having gate terminals controlled by the digital data from the memory matrix; said third transfer transistors having gate terminals controlled by said third clock signal; one of said third transfer transistors being connected between said interconnected drain terminals of said fourth and fifth transfer transistors and said gate terminal of one of said two output MOS-FETs; said one output MOS-FET being connected to the supply potential; and an inverter connected to said interconnected drain terminals of said fourth and fifth transfer transistors and in series with another of said third transfer transistors which is in turn connected to said gate terminal of said other of said two output MOS-FETs.

7. Device according to claim 6, including a clock-controlled output driver connected between the matrix memory and said gate terminals of said output MOS-FETs for receiving information from the memory matrix and delivering the digital data to said one output MOS-FET as a direct data signal and to said other output MOS-FET as an inverted data signal; a first discharge transistor having a source-drain path connected between said gate of said one output transistor and the reference potential, and a gate terminal; a second discharge transistor having a source-drain path connected between said other output transistor and the reference potential, and a gate terminal; another AND gate having an output connected to said gate terminals of said discharge transistors, an input controlled by the column address pulse, and another input; and another inverter connected between said third clock signal and said other input of said other AND gate.

8. Device according to claim 6, including a circuit for generating said third clock signal for said AND gate and said third transfer transistors, including first and second AND gates each having first and second inputs and an output, a third AND gate having first, second and third inputs and an output delivering said third clock signal, first, second, third and fourth delay elements each having an input and an output, a Schmitt trigger connected to said third input of said third AND gate, said Schmitt trigger receiving an input signal differing from a normal input level for actuating said Schmitt trigger, and another inverter having an input receiving the row address stroke and an output connected to said input of said first delay element as well as to said first inputs of said first, second and third AND gates, said output of said first delay element being connected to said second input of said first AND gate, said input of said second delay element being connected to said output of said first AND gate, said output of said second delay element being connected to said second input of said second AND gate, said input of said third delay element being connected to said output of said second AND gate, said output of third delay element being connected to said input of said fourth delay element, and said output of said fourth delay element being connected to said second input of said third AND gate.

9. Device according to claim 8, wherein said circuit is part of a pulse shaper including another circuit for generating said second clock-signal for controlling said other second MOS-FET, including a further inverter having an output delivering said second clock signal and an input, a fourth AND gate having an output connected to said input of said further inverter, a first input connected to said output of said second AND gate and a second input, and an additional inverter having a input receiving the column address pulse and an output connected to said second input of said fourth AND gate.

10. Device according to claim 9, including a fifth delay element having an input connected to said output of said fourth AND gate and an output, and a fifth AND gate having a first input directly connected to said output of said fourth AND gate, a second input connected to said output of said fifth delay element, and an output delivering said fourth clock signal for controlling said gate of said fifth transfer transistor.

11. Device for according to claim 9, including a clock-controlled output driver connected between the matrix memory and said gate terminals of said output MOS-FETs, said pulse shaper forming clock pulses from the column address pulse and the row address pulse for controlling said output driver.

12. Device according to claim 10, wherein said delay elements are adjusted to the same transit time.

13. Device according to claim 6, including RS flip-flops each being connected between a respective one of said second MOS-FETs and a respective one of said output MOS-FETs, said inverter being in the form of two series-connected pairs of transistors and a capacitor connected thereto.

14. Device according to claim 6, wherein said AND gate includes a MOS field effect transistor.

* * * * *